United States Patent [19]

Lawrence et al.

[11] Patent Number: 4,948,375
[45] Date of Patent: Aug. 14, 1990

[54] ADAPTOR ASSEMBLY FOR CIRCUIT BOARDS

[76] Inventors: Howard Lawrence, 49, Evelyn Crescent, Shirley, Southampton, Hampshire, England, SO1 5JS; Andrew J. Horsfield, 26, Spring Close, Air Oak, Hampshire, England

[21] Appl. No.: 234,153
[22] Filed: Aug. 19, 1988

[30] Foreign Application Priority Data

| Aug. 25, 1987 | [GB] | United Kingdom | 8720017 |
| Dec. 10, 1987 | [GB] | United Kingdom | 8728857 |
| Dec. 10, 1987 | [GB] | United Kingdom | 8728858 |
| Dec. 10, 1987 | [GB] | United Kingdom | 8728859 |

[51] Int. Cl.⁵ .................................... H01R 9/09
[52] U.S. Cl. ......................... 439/72; 29/747; 361/406; 439/888
[58] Field of Search ................... 439/68–73, 439/888; 361/400–406, 409; 174/52.4; 29/739, 741, 747, 758, 874, 876, 882, 883, 884, 827, 831, 840

[56] References Cited

U.S. PATENT DOCUMENTS

| 3,353,263 | 11/1967 | Helms | 174/68.5 |
| 3,506,879 | 4/1970 | Maxwell et al. | 361/406 |
| 4,230,384 | 10/1980 | Anhalt | 29/874 |
| 4,354,729 | 10/1982 | Grabbe | 29/874 |
| 4,359,252 | 11/1982 | Olsson et al. | 439/71 |
| 4,393,581 | 7/1983 | Cherian | 29/874 |
| 4,446,505 | 5/1984 | Long et al. | 361/413 |
| 4,577,400 | 3/1986 | Morgan | 29/747 |
| 4,688,870 | 8/1987 | Egawa et al. | 439/331 |
| 4,761,881 | 8/1988 | Bora et al. | 29/840 |

FOREIGN PATENT DOCUMENTS

| 1348521 | 3/1974 | United Kingdom . |
| 2051502 | 1/1981 | United Kingdom . |
| 2192100 | 12/1987 | United Kingdom . |

*Primary Examiner*—Neil Abrams
*Attorney, Agent, or Firm*—Oliff & Berridge

[57] ABSTRACT

A kit of parts for assembling an adaptor for electrically connecting a surface mounted component to a perforated circuit board comprises a multiplicity of wire wrap contact pins each having, integral with the trailing end of the pin and extending laterally with respect to its axis, an arm which, when the pin is engaged in a hole in a circuit board, bears against a major surface of the board and constitutes a footprint of the adaptor. The multiplicity of wire wrap pins comprise at least two groups of wire wrap pins, the lateral arms of the pins of each group being identical to one another and the lateral arms of the pins of one group differing from the lateral arms of the pins of each other group. The lateral arms of the pins of the groups are of such shapes that an adaptor for any one of a plurality of surface mounted components having arrays of leads differing from one another can be assembled on a circuit board by selecting appropriate pins, inserting the pins in holes in a circuit board and positioning the lateral arms on a major surface of the board in accordance with a predetermined pattern.

26 Claims, 7 Drawing Sheets

ADAPTOR ASSEMBLY FOR CIRCUIT BOARDS

This invention relates to circuit boards of the kind comprising a substantially rigid board of which at least the major surfaces are of electrically insulating material, which carries on one or each of its major surfaces a pattern of strips and/or pads of metal or metal alloy of high electrical conductivity, usually but not necessarily copper, and which has, extending through the board and underlying the electrically conductive metal strips and/or pads, a multiplicity of mutually spaced holes Circuit boards of this kind will hereinafter, for convenience, be referred to as "circuit boards of the kind described".

The invention is particularly concerned with adapters which are suitable for use in effecting electrical connection between electrically conductive metal strips and/or pads of a circuit board of the kind described and the leads of a surface mounted component, which leads are mutually spaced around at least a part of the periphery of the component.

The holes of circuit boards of the kind described currently in general use are either arranged in a pattern of rows and columns with the centers of adjacent holes being spaced by 2.54 mm or in an array based on multiples of 2.54 mm. The leads of surface mounted components currently in use are mutually spaced around at least a part of the periphery of the component, usually but not necessarily at 1.27 mm intervals, in order that the component is compact and therefore provides for a high packing density on a circuit board. Since the spacing of the leads of surface mounted components is not compatible with the spacing of the holes in a circuit board of the kind described, it is the current practice to effect electrical connection between the leads of a surface mounted component and appropriate electrically conductive metal strips and/or pads of a circuit board of the kind described by means of an adaptor having pins which are appropriately spaced for electrical connection in holes in the circuit board and having an array of contacts of metal or metal alloy of high electrical conductivity which are electrically connected to said pins by electrically conductive tracks on the surface of the adaptor and which are so mutually spaced apart that the leads of a surface mounted component can be soldered or otherwise electrically connected thereto. Such contacts are generally known, and for convenience hereinafter will be referred to, as "footprints". The number of surface mounted components having arrays of leads differing from one another is large and, hence, the number of adaptors that a manufacturer must provide, and the number of adaptors that a user must hold, with arrays of footprints differing from one another to accommodate the different arrays of leads of such surface mounted components is also large.

It is an object of the present invention to provide, for use with a circuit board of the kind described, a kit of parts for the assembly of an adaptor for effecting electrical connection between the leads of a surface mounted component and electrically conductive strips and/or pads of the circuit board, which kit of parts can be used to assemble any one of a plurality of adaptors with arrays of footprints differing from one another.

According to the invention, the kit of parts comprises a multiplicity of wire wrap contact pins each suitable for insertion in a hole in, and for effecting electrical contact with an electrically conductive strip or pad of, a circuit board of the kind described and each having, integral with the trailing end of the pin and extending laterally with respect to its axis, a footprint forming lateral arm which, when the pin is engaged in said hole, bears against a major surface of the circuit board and is adapted to constitute a footprint of an adaptor to which footprint a surface mounted component can be soldered, said multiplicity of wire wrap pins comprising at least two groups of wire wrap pins, the footprint forming lateral arms of the pins of each group, being identical with one another and the footprint forming lateral arms of the pins of one group differing from the footprint forming lateral arms of the pins of the or each other group, the footprint forming lateral arms of the pins of said groups being of such shapes that an adaptor having an array of footprints appropriate for any one of a plurality of surface mounted components having arrays of leads differing from one another can be assembled on a circuit board of the kind described by selecting from said groups wire wrap pins having appropriate footprint forming lateral arms and by inserting the selected wire wrap pins in holes in the circuit board and positioning the footprint forming lateral arms of the selected wire wrap pins on a major surface of the board in accordance with a predetermined pattern.

Preferably, the kit of parts also includes a plurality of patterns in accordance with any one of which an adaptor for one of a plurality of surface mounted components having arrays of leads differing from one another can be assembled on a circuit board of the kind described from wire wrap pins selected from the groups of wire wrap pins of the kit.

The trailing end of each wire wrap pin of at least one of said groups of wire wrap pins of the kit of parts may be integral with the lateral arm of the pin at a position at or near one end of the arm (so that in side elevation the pin is of approximately inverted L-shape) or the trailing end of said wire wrap pin may be integral with the lateral arm of the pin at a position intermediate the ends of the arm (so that in side elevation the pin is of approximately T-shape) Preferably, however, with a view to facilitating positioning of the lateral arm of a wire wrap pin in accordance with a predetermined pattern when the pin is inserted in a hole in a circuit board of the kind described, the trailing end of each wire wrap pin of at least one of said groups of wire wrap pins is integral with the lateral arm at a position at or near one end of the arm and the lateral arm has, at or near the other end of the arm, an integral supplementary pin which is so spaced from the wire wrap pin that the supplementary pin will engage in another hole in the circuit board (so that in side elevation the pin is approximately of inverted U-shape). The supplementary pin of said wire wrap pin may be of a shorter length than that of the wire wrap pin. In some circumstances, the supplementary pin of said wire wrap pin may be of such a transverse cross-section that it is suitable for use as a supplementary wire wrap pin.

Preferably, each wire wrap contact pin of each group of wire wrap contact pins of the kit of parts over a minor part of its length adjacent its lateral arm has a lateral dimension which is greater than the equivalent lateral dimension of the remaining major part of the length of the pin and which is such that said minor part of the length of the pin will make an interference fit in a hole of a circuit board of the kind described.

For example, for use with a circuit board of the kind described in which the holes each has a diameter of 1.05 mm, each wire wrap contact pin over said minor part of its length will have a lateral dimension of 1.04 mm and an equivalent lateral dimension over the remaining major part of its length of 0.68 mm.

Where a wire wrap pin is integral with the lateral arm at a position at or near one end of the arm and the lateral arm has, at or near the other end of the arm, an integral supplementary pin, preferably over a minor part of the length of the supplementary pin adjacent the lateral arm said minor part has lateral dimension which is greater than the equivalent lateral dimension of the remaining major part of the length of the supplementary pin and which is such that said minor part of the length of the supplementary pin will make an interference fit in a hole of a circuit board of the kind described.

At a position intermediate of its ends, each wire wrap contact pin of the kit of parts may be notched so that a part of the pin can be readily broken away if not required.

Where the rectilinear distance between the axes of a wire wrap contact pin and its supplementary pin is greater than n, where n is the pitch between adjacent holes in a circuit board of the kind described, to avoid any risk of unwanted electrical contact between the lateral arm of the wire wrap pin and electrically conductive strips, pads or tracks positioned between the holes into which the wire wrap and supplementary pins are to engage, preferably the underlying edge of the lateral arm has a recess extending between end parts of said edge, which end parts constitute shoulders which, when the wire wrap and supplementary pins engage in said holes, bear against a major surface of the circuit board.

The wire wrap contact pins of the kit of parts may each be made of phosphor bronze and coated with tin/lead or similar electrically conductive material for reducing contact resistance between the wire wrap pin, and when present the supplementary pin, and the electrically conductive material of a strip or pad.

With a view to reducing the risk of inadvertent electrical connection between adjacent footprints of an adaptor when the leads of a surface mounted component are soldered thereto, prior to insertion of the wire wrap pins into selected holes of a circuit board, a preformed spacer of electrically insulating material may be positioned on the circuit board, which spacer has therethrough a plurality of holes arranged in a pattern corresponding to that of holes in the circuit board and having between adjacent holes a pair of upstanding walls which are integral with the spacer and which are transversely spaced apart, and said wire wrap pins are inserted through holes of the preformed spacer into holes of the underlying circuit board, the lateral arms of the pins being positioned between upstanding walls which protrude upwardly beyond the lateral arms and serve as barriers to flow of solder from one lateral arm to another. Accordingly, preferably, the kit of parts also includes a plurality of preformed spacers as above described.

The kit of parts may also include at least one pin insertion tool for facilitating insertion into a hole of a circuit board of the kind described a wire wrap contact pin selected from the kit. Preferably, the pin insertion tool comprises a substantially rigid elongate member having at one end a pair of laterally extending shoulders which extend substantially parallel to one another and which are transversely spaced apart to define a laterally extending channel, each shoulder having a thickness which is less than the distance between the lateral arms of two wire wrap pins when the pins are so positioned in holes in a circuit board of the kind described that the lateral arms of the pins overlie holes in adjacent rows or columns of the board, and the channel having a width slightly greater than the thickness of the lateral arm of the wire wrap pin and a depth less than the height of the lateral arm of the wire wrap pin.

To facilitate insertion of wire wrap pins into selected holes in a circuit board of the kind described using the preferred pin insertion tool, the circuit board may be placed on a board of substantially rigid material having an array of columns and rows of holes whose pitch corresponds to that of the holes of the circuit board so that the holes in the circuit board overlie holes in the board and, when wire wrap pins are inserted into selected holes of the circuit board using the preferred pin insertion tool, the parts of the pins protruding from the back of the circuit board will be temporarily located in holes in the supporting rigid board. However, in place of the rigid board we prefer to employ a block of cellular plastics material having a pair of opposed major surfaces lying in substantially parallel planes so that, when the circuit board is placed on top of the block of cellular plastics material and wire wrap pins are inserted downwardly into selected holes in the board using the preformed pin insertion tool, the parts of the pins protruding from the back of the circuit board will temporarily pierce the block of cellular plastics material. In this case, no care is necessary with regard to positioning the circuit board on the block of cellular plastics material and the cellular plastics material is substantially less expensive than the rigid board with the array of columns and rows of holes. Indeed, the block of cellular plastics material may constitute part of the packing employed in a box or other container in which the kit of parts is supplied.

Accordingly, the kit of parts may further include a block of cellular plastics material having a pair of opposed major surfaces lying in substantially parallel planes.

The block may be made of any suitable plastics material, cellular polyethylene currently being preferred.

The kit of parts may also include a pin extraction tool for facilitating removal of a selected wire wrap pin and its integral supplementary pin from a circuit board of the kind described. Preferably, the pin extraction tool comprises a substantially rigid elongate member having at one end a laterally extending head which has in its laterally extending end face at least two blind holes whose axes are substantially parallel to the axis of the elongate member and are laterally spaced apart by any one of n, 2n or 3n, where n is the pitch between adjacent holes in a circuit board of the kind described, each of said blind holes having a depth which is at least slightly less than the axial length of the supplementary pin of a wire wrap pin and an internal diameter which is slightly greater than the lateral dimension of a wire wrap pin or its supplementary pin, and the head having a thickness which is substantially less than 2n.

In a preferred embodiment of the pin extraction tool, one of the blind holes (the deep hole) has a depth slightly less than the axial length of a wire wrap contact pin and the other of the blind holes (the shallow hole) has a depth less than that of the deep hole and slightly less than the axial length of the supplementary pin of a wire wrap contact pin.

In a preferred embodiment the improved kit of parts includes two pin extraction tools in each of which the deep and shallow blind holes are spaced apart by a distance 3n and there is provided in the laterally extending end face of the head between the deep and shallow holes two additional blind holes, one of which is a deep hole and one of which is a shallow hole, whose axes are substantially parallel to and lie in the same plane as the axes of the deep and shallow holes, the axes of adjacent holes being spaced apart by a distance n. In one of the two pin extraction tools, the two deep holes are adjacent one another at one side of the head and the two shallow holes are adjacent one another at the other side of the head, and in the other of the two pin extraction tools, one deep hole is positioned between two shallow holes and one shallow hole is positioned between two deep holes.

The kit of parts of the present invention is suitable for use both with circuit boards of the kind described which are of conventional construction with the multiplicity of mutually spaced holes extending through both the rigid board and the overlying electrically conductive metal strips and/or pads, and with circuit boards of the kind described which comprise a substantially rigid board of which at least the major surfaces are of electrically insulating material and which has extending through the rigid board a multiplicity of holes arranged in a pattern of rows and columns and, secured to one major surface of the board, a separately formed flexible sheet of electrically insulating material which carries on the surface of the flexible sheet remote from the rigid board a pattern of electrically conductive strips and/or pads which overlies holes in the rigid board, the strips and/or pads being of such an electrically conductive material and of such a thickness that, when a pin is urged through an electrically conductive strip or pad and the underlying flexible sheet into an underlying hole in the rigid board, electrically conductive material pierced by the pin will effect an electrical contact with the pin passing therethrough.

The kit of parts of the present invention has the important advantage that a user can assemble any one of a plurality of adaptors suitable for a plurality of surface mounted components having arrays of leads differing from one another and, as a consequence, such a user no longer need hold in stock for this purpose a large number of preformed adaptors differing from one another.

The invention also includes, for use in a kit of parts as hereinbefore described, a wire wrap contact pin as hereinbefore described.

The invention is further illustrated by a description, by way of example, of a preferred kit of parts for use, with a circuit board of the kind described, in the assembly of any one of a plurality of adaptors suitable for a plurality of surface mounted components having arrays of leads differing from one another, with reference to the accompanying drawings, in which.

The preferred kit of parts comprises two groups of wire wrap pins, the pins of one group (FIGS. 1 and 2) differing from the pins of the other group (FIGS. 3 and 4); a pin insertion tool (FIGS. 17 and 18); a pin extraction tool (FIGS. 19 and 20); and a plurality of patterns of adaptors for use with a plurality of surface mounted components having arrays of leads differing from one another, which adaptors can be assembled using pins of the two groups or from some or all of five groups of pins. The preferred kit of parts also includes a block of cellular polyethylene (FIG. 23) having a pair of opposed major surfaces laying in parallel planes. The preferred kit of parts is particularly suitable for use with circuit boards of the kind described in which the pitch between adjacent holes in the circuit board is n and the pitch between adjacent leads of any surface mounted component to be mounted on the circuit board is n/2.

Figure 1:
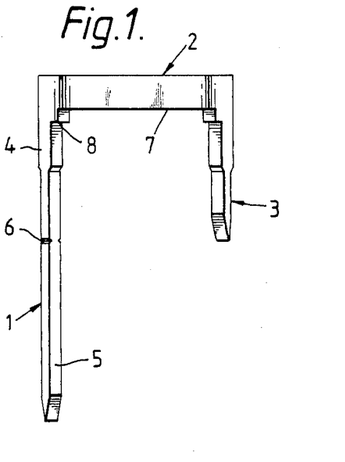
FIGS. 1 and 2, 3 and 4, 5 and 6, 7 and 8, and 9 and 10, respectively, are side and underside views of a wire wrap contact pin of each of five groups of wire wrap contact pins.
Figure 2:
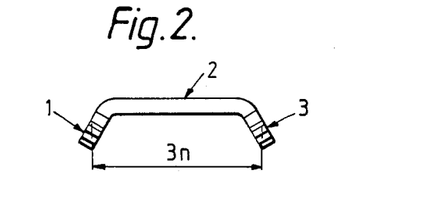

A typical wire wrap pin 1 of the first group of wire wrap pins is shown in FIGS. 1 and 2, the pin having a lateral arm 2 and a supplementary pin 3 and the axes of the wire wrap pin and supplementary pin being spaced apart by a distance 3n. The wire wrap pin 1 over a minor part 4 of its length adjacent its lateral arm 2 has a lateral dimension which is greater than the equivalent lateral dimension of the remaining major part 5 of the length of the pin and which is such that the minor part of the length of the pin will make an interference fit in a hole of a circuit board of the kind described. At a position intermediate of its ends, the wire wrap pin 1 has notches 6 so that a portion of the major part 5 of the length of the pin can be broken away if not required. The underlying edge of the lateral arm 2 has a notch 7 extending between end parts of the edge, which end parts constitute shoulders 8 which, when the wire wrap pin 1 and its supplementary pin 3 engage in holes in a circuit board, bear against a major surface of the board so that the lateral arm will bridge any electrically conductive strip or pad positioned between the holes. Over a major intermediate part of its length, the lateral arm 2 is displaced laterally with respect to the line passing through the axes of the wire wrap pin 1 and supplementary pin 3 by a distance n/2 so that, when the wire wrap pin and supplementary pin engage in holes lying in a single column or a single row of a circuit board, the lateral arm will extend substantially parallel to and will be transversely spaced by a distance n/2 from the single columns or single row.

Figure 3:
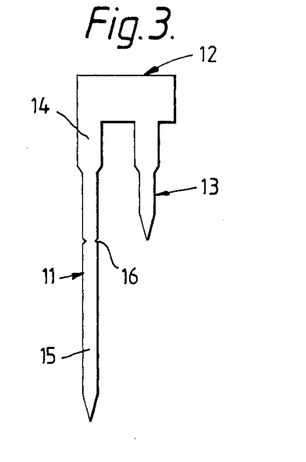
Figure 4:
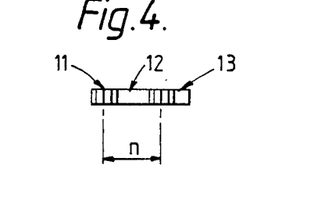

FIGS. 3 and 4 illustrate a typical wire wrap pin 11 of the second group of wire wrap pins, which wire wrap pin has a lateral arm 12 and a supplementary pin 13. The wire wrap pin 11 has a minor part 14 of a lateral dimension greater than the equivalent lateral dimension of the remaining major part 15 and, at a position 16 intermediate of its ends, is notched. The axes of the wire wrap pin 11 and of the supplementary pin 13 are spaced apart by a distance n and the lateral arm 12 extends directly between the wire wrap pin and the supplementary pin. When the wire wrap pin 11 and supplementary pin 13 are inserted in holes lying in a single column or a single row of a circuit board, the lateral arm 12 will extend along the single column or row.

FIGS. 5 to 10 illustrate typical wire wrap pins of three further groups of wire wrap pins, any one or more of which further groups may be included in the kit of parts, if desired.

Figure 5:
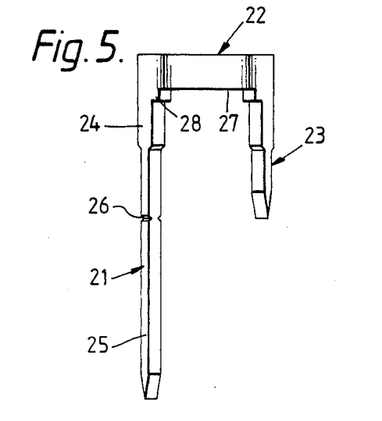
Figure 6:
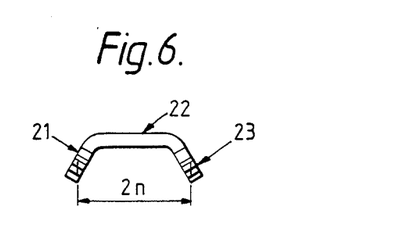

A typical wire wrap pin 21 of the third group of wire wrap pins is illustrated in FIGS. 5 and 6 and has a lateral arm 22 and a supplementary pin 23. The wire wrap pin 21 has a minor part 24 of a lateral dimension greater than the equivalent lateral dimension of the remaining major part 25 and, at a position 26 intermediate of its ends, is notched. The wire wrap pin 21 and supplementary pin 23 are spaced apart by a distance 2n and, over a major intermediate part of its length, the lateral arm 22 is laterally displaced with respect to the line passing through the axes of the wire wrap pin and supplementary pin by a distance n/2. The underlying edge of the lateral arm 22 has a recess 27 extending between end parts of the edge which constitute shoulders 28. When the wire wrap pin 21 and supplementary pin 23 are inserted in holes lying in a single column or a single row of a circuit board, the lateral arm 22 will extend parallel to and will be transversely spaced by a distance n/2 from the single column or single row.

Figure 7:
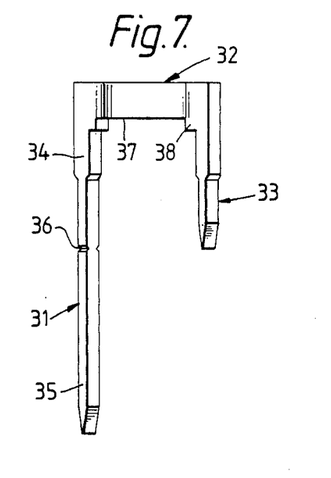
Figure 8:
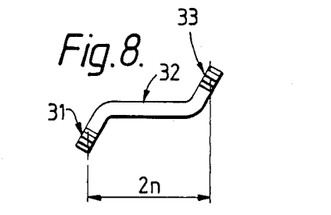

FIGS. 7 and 8 illustrate a typical wire wrap pin 31 of the fourth group of wire wrap pins, which pin has a lateral arm 32 and a supplementary pin 33. The wire wrap pin 31 has a minor part 34 adjacent the lateral arm 32 of a lateral dimension greater than the equivalent lateral dimension of the remaining major part 35 and, at a position intermediate of its ends, has notches 36. The underlying edge of the lateral arm 32 has a recess 37 extending between end parts of the edge constituting shoulders 38 which will bear against a major surface of a circuit board when the wire wrap pin 31 and supplementary pin 33 engage in holes in the board. The wire wrap pin 31 and supplementary pin 33 are so spaced apart that, when the wire wrap pin is inserted in a hole in one column (or row) of a circuit board, the supplementary pin will engage in a hole in an adjacent column (or row), the rows (or columns) in which said holes lie being spaced apart by a distance 2n. Over a major intermediate part of its length, the lateral arm 32 is laterally spaced from the axis of the wire wrap pin 31 by a distance n and is laterally spaced in the opposite direction from the axis of the supplementary pin 33 by a distance n so that, when the wire wrap pin and supplementary pin are inserted in holes as described, the major intermediate part of the length of the lateral ar will extend parallel to and will overlie the column (or row) between the columns (or rows) containing the holes in which the wire wrap pin and supplementary pin engage.

Figure 9:
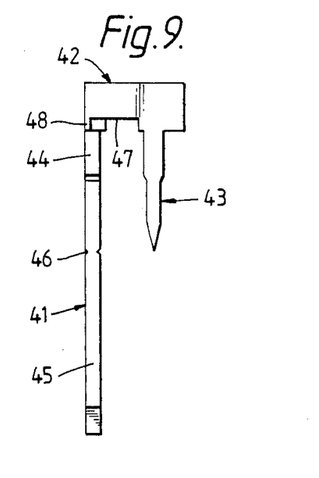
Figure 10:
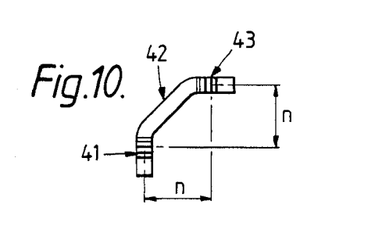

A typical wire wrap pin 41 of the fifth group of wire wrap pins is illustrated in FIGS. 9 and 10. As is the case with the wire wrap pins illustrated in FIGS. 1 to 8, the wire wrap pin 41 has a minor part 44 of a lateral dimension greater than the equivalent lateral dimension of the remaining major part 45 so that the minor part will make an interference fit in a hole of a circuit board of the kind described. Intermediate of its ends, the wire wrap pin 41 has notches 46. The wire wrap pin 41 has a lateral arm 42 and a supplementary pin 43, the underlying edge of the lateral arm having a recess 47 extending between end parts of the edge constituting shoulders 48. The wire wrap pin 41 and supplementary pin 43 are so spaced apart that, when the wire wrap pin is inserted in a hole in one column (or row) of a circuit board, the supplementary pin will be inserted in a hole in an adjacent column (or row), the rows (or columns) in which said holes lie being spaced apart by a distance n. When the wire wrap pin 41 and supplementary pin 43 are so inserted in holes in a circuit board, a major intermediate part of the length of the lateral arm 42 will lie at an angle of approximately 45° to the columns (or rows) containing the holes in which the pins engage.

FIGS. 11 to 14 illustrate four typical patterns of the plurality of patterns of adaptors which patterns are conveniently provided on a layout sheet.

Figure 11:
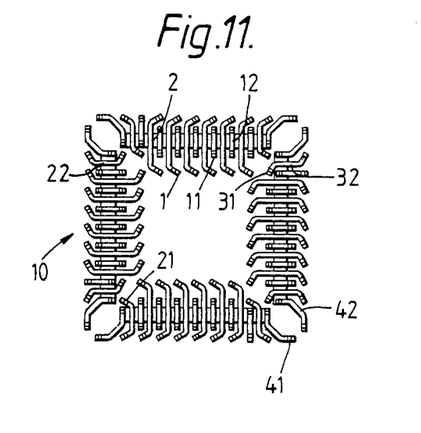
FIGS. 11 to 14 are patterns of four typical adaptors which can be assembled from wire wrap contact pins selected from some or all of said five groups of wire wrap pins.
Figure 12:
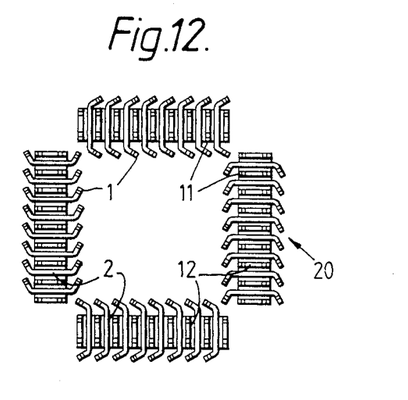
Figure 13:
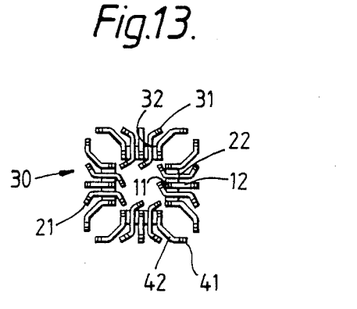
Figure 14:
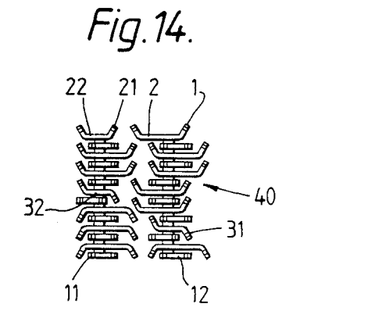

The adaptor 10 whose pattern is shown in FIG. 11 can be assembled from wire wrap pins selected from the five groups of wire wrap pins as illustrated in FIGS. 1 to 10; the adaptor 20 whose pattern is shown in FIG. 12 can be selected from wire wrap pins assembled from the two groups of wire wrap pins as illustrated in FIGS. 1 to 4; the adaptor 30 whose pattern is shown in FIG. 13 can be assembled from wire wrap pins selected from the four groups of wire wrap pins as illustrated in FIGS. 3 to 10; and the adaptor 40 whose pattern is shown in FIG. 14 can be assembled from wire wrap pins selected from the four groups of wire wrap pins as illustrated in FIGS. 1 to 8.

Figure 15:
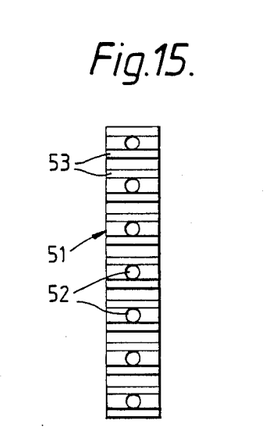
FIGS. 15 and 16, respectively, are plan and sectional side views of a preformed spacer of electrically insulating material.
Figure 16:
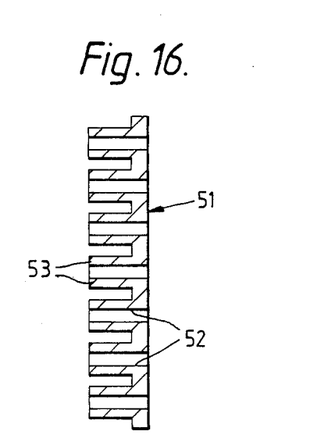

The preferred kit of parts may also include a plurality of preformed elongate spacers of electrically insulating material, of which an example is illustrated in FIGS. 15 and 16, for reducing the risk of inadvertent electrical connection between adjacent footprints of an adaptor when the leads of a surface mounted component are soldered to the footprints. The preformed elongate spacer is a molded strip 51 of electrically insulating plastics material having therethrough a plurality of holes 52 mutually spaced in a line corresponding to the spacing of holes in rows and columns in a circuit board. Between adjacent holes 52 the strip 51 has a pair of upstanding walls 53 which are so transversely spaced apart that a lateral arm of a wire wrap pin can be positioned between them.

Figure 21:
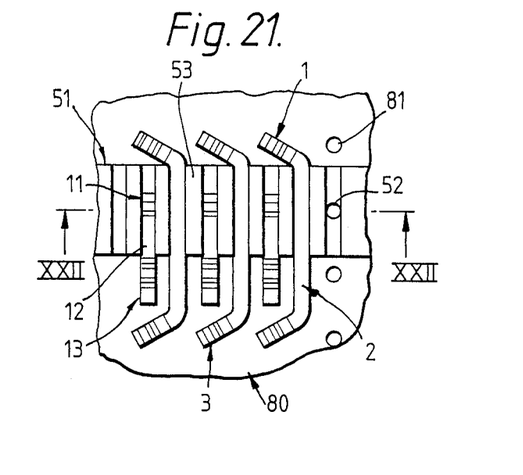
FIG. 21 is a fragmental plan view of a circuit board of the kind described on which is mounted a preformed spacer as shown in FIGS. 15 and 16 and wire wrap contact pins as shown in FIGS. 1 to 4.
Figure 22:
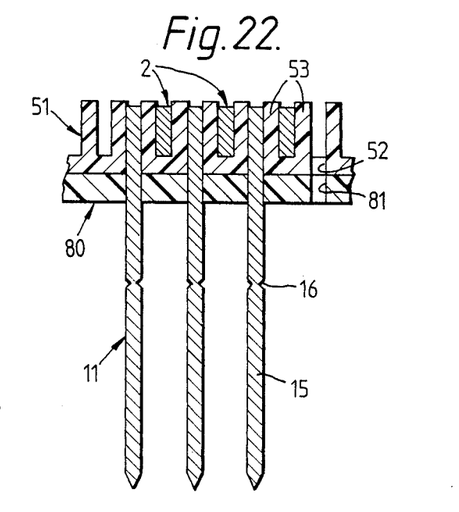
FIG. 22 is a fragmental sectional side view of the circuit board taken on the line XXII—XXII in FIG. 21.

As will be seen on referring to FIGS. 21 and 22, when a prefromed elongate spacer 51 is used in the assembly of an adaptor for effecting electrical connection between the leads of a surface mounted component and electrically conductive lands of the circuit board, the spacer overlies a row or column of holes 81 in the board 80 with the holes 52 in the spacer in axial alignment with the holes 81 in the board. Wire wrap contact pins 11 pass through holes 52 in the spacer 51 into the underlying holes 81 on the board 80 and supplementary pins 13 are positioned in adjacent holes in the board so that the lateral arms 12 are positioned between upstanding walls 52 on the spacer. Each wire wrap pin 1 and its supplementary pin 3 are inserted in holes 81 in the board 80 lying in the same column or row as the holes in which are positioned a wire wrap pin 11 and its supplementary pin 13 so that the lateral arm 2 of the wire wrap pin 1 is positioned between upstanding walls 53 on the spacer. The upstanding walls 53 protrude upwardly beyond the lateral arms 2 and 12 of the contact pins 1 and 11 and serve as barriers to flow of solder to and from an adjacent lateral arm when leads of a surface mounted component are soldered to the lateral arms.

Figure 17:
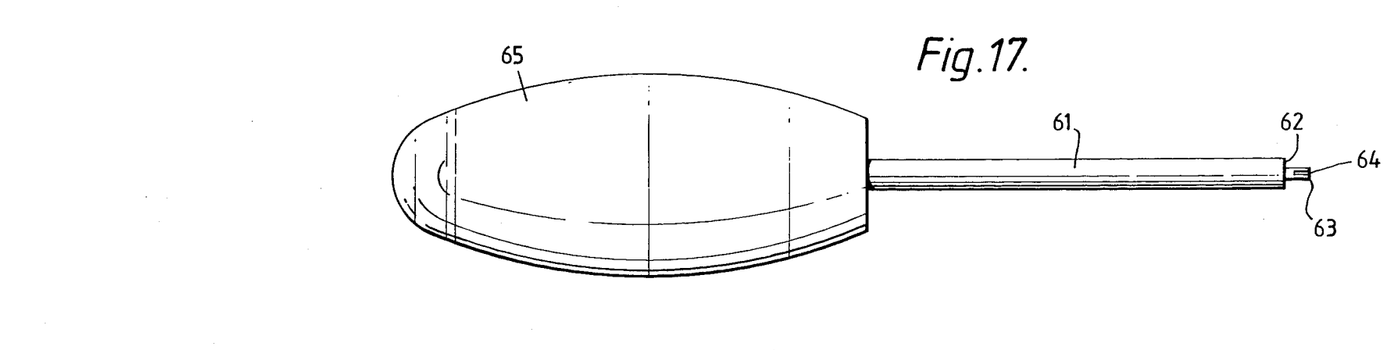
FIGS. 17 and 18, respectively, are side and end views, drawn on an enlarged scale, of a preferred pin insertion tool.
Figure 18:
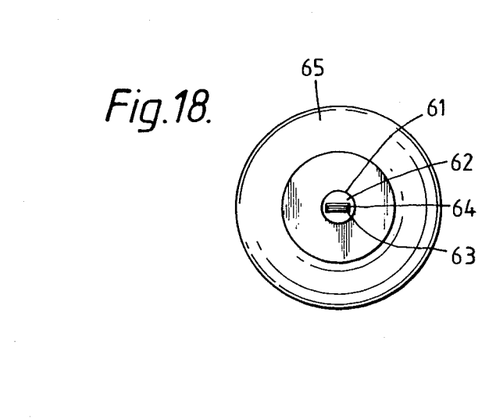

The pin insertion tool illustrated in FIGS. 17 and 18 comprises a rigid rod 61 which has upstanding from an end face 62 a pair of laterally extending shoulders 63 which extend parallel to one another and which are transversely spaced apart to define a laterally extending channel 64. Each shoulder 63 has a thickness which is less than the distance between the lateral arms of two wire wrap pins when the pins are so positioned in holes of a circuit board of the kind described that the lateral arms of the pins overlie holes in adjacent rows or columns of the board. The channel 64 has a width slightly greater than the thickness of the lateral arm of the wire wrap pin and a depth less than the height of the lateral arm of the wire wrap pin. A handle 65 is detachably secured to the end of the rod 61 remote from the shoulders 63.

Figure 23:
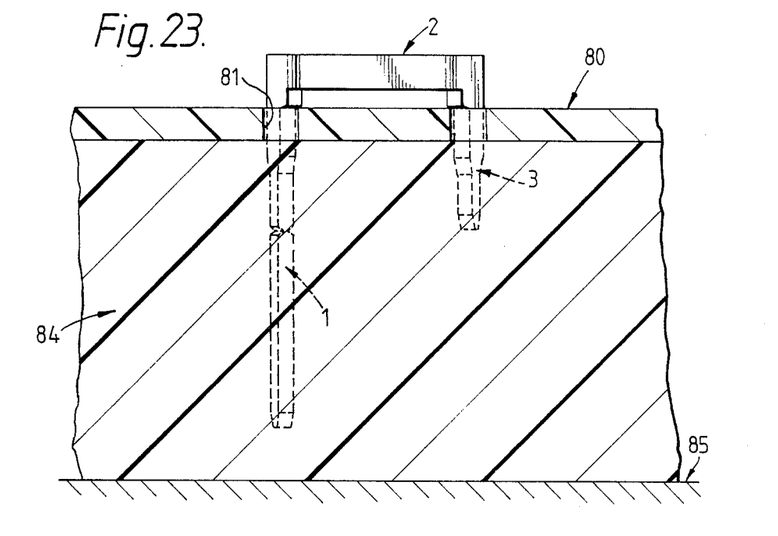
FIG. 23 is a fragmental side view of a preferred method of inserting wire wrap pins into holes in a circuit board of the kind described using the pin insertion tool shown in FIGS. 17 and 18.

FIG. 23 illustrates one method of using the pin insertion tool to insert a wire wrap pin 1 and its supplementary pin 3 into holes 81 of a circuit board 80 of the kind described. In this method, a block 84 of cellular plastics material having a pair of opposed major surfaces lying in parallel planes is placed on a bench 85, the circuit board 80 is placed on top of the block of cellular plastics material and the wire wrap pin 1 and its supplementary pin 3 are partially inserted into holes 81 of the board. The pin insertion tool is then applied to the pin so that the lateral arm 2 of the pin engages in the channel 64 of the tool and the shoulders 63 depend on the opposite sides of the lateral arm. Pressure is inserted on the tool to push the pins 1 and 3 fully home in the holes 81 until the lateral arm 2 bears against the front face of the board 80, the portions of the pins protruding from the back underside of the board passing temporarily into the block 84 of cellular plastics material. The circuit board 80 with the pins 1 and 3 mounted thereon is then removed from the block 84 of cellular plastics material. This method has the advantage that no positioning of the circuit board on the block of cellular plastics material is required.

Figure 24:
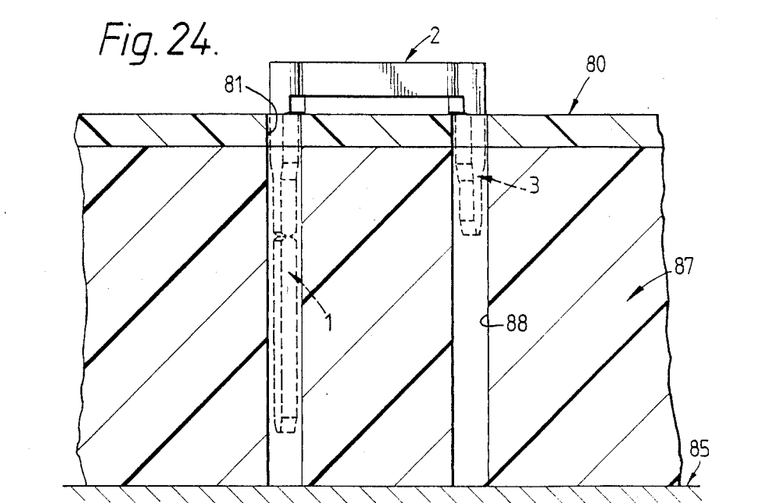
FIG. 24 is a fragmental side view of an alternative method of inserting wire wrap pins into holes in a circuit board of the kind described using the pin insertion tool shown in FIGS. 17 and 18.

FIG. 24 illustrates a second method of using the pin insertion tool shown in FIGS. 17 and 18 to insert a wire wrap pin 1 and its supplementary pin 3 into holes 81 of a circuit board 80 of the kind described. In this method, a rigid board 87 of electrically insulating material having an array of columns and rows of holes 88 whose pitch corresponds to that of the holes 81 of the circuit board 80 is placed on a bench 85 and the circuit board 80 is positioned on top of the rigid board 87 so that the holes in the circuit board overlie the holes in the rigid board. The wire wrap pin 1 and its supplementary pin 3 are then partially inserted into holes 81 of the circuit board 80 and the pin insertion tool is applied to the pin so that the lateral arm 2 of the pin engages in the channel 64 of the tool and the shoulders 63 depend on opposite sides of the lateral arm. Pressure is exerted on the tool to push the pins 1 and 3 fully home in the holes 81 until the lateral arm 2 bears against the front face of the board, the portions of the pins protruding from the underside of the board 81 passing temporarily into the holes 88 of the rigid board 87. The circuit board 80 with the pins mounted thereon is then removed from the rigid board 87.

Figure 19:
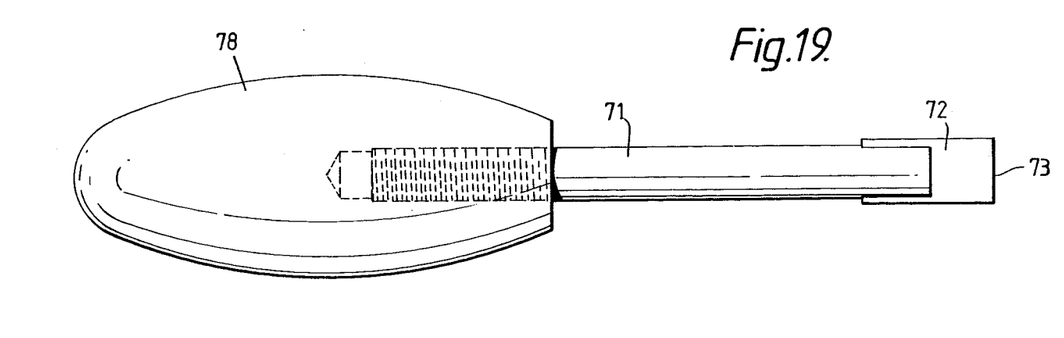
FIGS. 19 and 20, respectively, are side and end views, drawn on an enlarged scale, of a preferred pin extraction tool.
Figure 20:
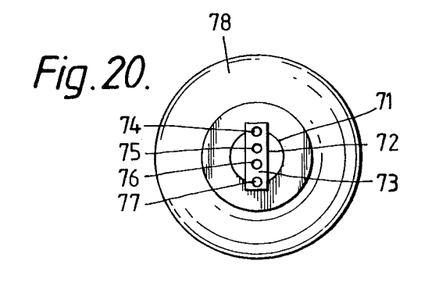

The pin extraction tool shown in FIGS. 19 and 20 comprises a rigid rod 71 having secured at one end a separately formed laterally extending head 72 which has in its laterally extending end face 73 four blind holes 74, 75, 76 and 77 whose axes are parallel to the axis of the rod. Adjacent blind holes of the four blind holes 74, 75, 76 and 77 are laterally spaced apart by n, where n is the pitch between adjacent holes in a circuit board of the kind described. Each blind hole 74, 75, 76 and 77 has a depth slightly less than the axial length of the supplementary pin of a wire wrap pin and an internal diameter slightly greater than the lateral dimension of the major part of the length of a wire wrap or supplementary pin. The laterally extending head 72 has a thickness substantially less than 2n. A handle 78 is detachably secured to the end of the rod 71 remote from the head 72.

In use, to remove a wire wrap pin constituting a component part of an assembled adaptor from a circuit board of the kind described and having its integral supplementary pin spaced from the wire wrap pin by a distance n, 2n or 3n, an end part of the wire wrap pin protruding from the rear face of the circuit board is broken away so that the wire wrap pin is approximately the same length as the supplementary pin. The head 72 of the tool is then applied to the wire wrap pin and supplementary pin protruding from the rear face of the circuit board so that the wire wrap pin enters the blind hole 74 in the head and the supplementary pin enters any one of the blind holes 75, 76 and 77 in the head (depending on the lateral spacing between the axes of the wire wrap and supplementary pins) and the head is urged towards the circuit board until the free ends of the pins abut the blind ends of the holes. Further pressure on the tool will push the wire wrap pin and its associated supplementary pin partially out of the holes in the circuit board. The wire wrap pin and its supplementary pin can then be removed by hand from the front face of the circuit board.

Since the blind holes 74, 75, 76 and 77 in the head 72 of the tool each have a diameter only slightly greater than the lateral dimension of a wire wrap or supplementary pin, the walls of the holes prevent buckling of the pins as pressure is imparted on the tool to push the pins out of the holes of the circuit board. As a consequence, a wire wrap pin that has been removed from a circuit board using the tool is suitable for re-use in the assembly of an adaptor.

What we claim as our invention is:

1. For use with a circuit board of the kind comprising a substantially rigid board of which at least the major surfaces are of electrically insulating material, which carries on at least one of its major surfaces a pattern of electrically conductive lands constituted by at least one of electrically conductive strips and electrically conductive pads, and which has, extending through the board and underlying the electrically conductive lands, a multiplicity of mutually spaced holes, a kit of parts for the assembly of an adaptor for effecting electrical connection between the leads of a surface mounted component and electrically conductive lands of the circuit board, which kit of parts comprises a multiplicity of wire wrap contact pins each suitable for insertion in a hole in, and for effecting electrical contact with an electrically conductive land of, a circuit board and each having, integral with the trailing end of the pin and extending laterally with respect to its axis, a footprint forming lateral arm which, when the pin is engaged in said hole, bears against a major surface of the circuit board and is adapted to constitute a footprint of an adaptor to which footprint a surface mounted component can be soldered, said multiplicity of wire wrapping comprising at least two groups of wire wrap pins, the footprint forming lateral amrs of the pins of each group being identical with one another and the footprint forming lateral arms of the pins of one group differing from the footprint forming lateral arms of the pins of the other group, to the footprint forming lateral arms of the pins of said groups being of such shapes that an adaptor having an array of footprints appropriate for any one of a plurality of surface mounted components having arrays of leads differing from one another can be assembled on a circuit board by selecting from said groups wire wrap pins having appropriate footprint forming lateral arms, and by inserting the selected wire wrap pins in holes in the circuit board and positioning the footprint forming lateral arms of the selected wire wrap pins on a major surface of the board in accordance with a predetermined pattern.

2. A kit or parts as claimed in claim 1, wherein the kit also includes a plurality of patterns in accordance with any one of which an adaptor for one of a plurality of surface mounted components having arrays of leads differing from one another can be assembled on a circuit board from wire wrap pins selected from the groups of wire wrap pins of the kit.

3. A kit or parts as claimed in claim 1, wherein each wire wrap contact pin of each group of wire wrap contact pins over a minor part of its length adjacent its lateral arm has a lateral dimension which is greater than the equivalent lateral dimension of the remaining major part of the length of the pin and which is such that said minor part of the length of the pin will make an interference fit in a hole of a circuit board.

4. A kit of parts as claimed in claim 1, wherein the trailing end of each wire wrap pin of at least one of said groups of wire wrap pins is integral with the lateral arm at a position at or near one end of the arm and the lateral arm has, at or near the other end of the arm, an integral supplementary pin which is so spaced from the wire wrap pin that the supplementary pin will engage in another hole in the circuit board.

5. A kit of parts as claimed in claim 4, wherein the supplementary pin of said wire wrap pin is of a shorter length than that of the wire wrap pin.

6. A kit of parts as claimed in claim 4, wherein the supplementary pin of said wire wrap pin is of substantially rectangular transverse cross-section.

7. A kit of parts as claimed in claim 4, wherein over a minor part of the length of the supplementary pin adjacent the lateral arm said minor part has a lateral dimension which is greater than the equivalent lateral dimension of the remaining major part of the length of the supplementary pin and which is such that said minor part of the length of the supplementary pin will make an interference fit in a hole of a circuit board.

8. A kit of parts as claimed in claim 4, in which the rectilinear distance between the axes of each wire wrap pin of said group and its supplementary pin is greater than n, where n is the pitch between adjacent holes in a circuit board, wherein the underlying edge of the lateral arm has a recess extending between end parts of said edge, which end parts constitute shoulders which, when the wire wrap and supplementary pins engage in said holes, bear against a major surface of the circuit board.

9. A kit of parts as claimed in claim 1, wherein the trailing end of each wire wrap pin of at least one of said groups of wire wrap pins is integral with the lateral arm of the pin at a position at or near one end of the arm.

10. A kit of parts as claimed in claim 1, wherein the trailing end of each wire wrap pin of at least one of said groups of wire wrap pins is integral with the lateral arm of the pin at a position intermediate the ends of the arm.

11. A kit of parts as claimed in claim 1, wherein each wire wrap contact pin of each group of wire wrap contact pins is notched at a position intermediate of its length so that a part of the pin can be readily broken away if not required.

12. A kit of parts as claimed in claim 1, wherein the kit also includes a plurality of preformed spacers of electrically insulating material, each of which spacers has therethrough a plurality of holes arranged in a pattern corresponding to that of holes in the circuit board and having between adjacent holes a pair of upstanding walls which are integral with the spacer and which are so transversely spaced apart that, when a wire wrap pin is inserted through a hole in the spacer into a hole in the underlying circuit board, the lateral arm of the wire wrap pin is positioned between the lands and the lands protrude upwardly beyond the lateral arm.

13. A kit of parts as claimed in claim 1, wherein the kit also includes at least one pin insertion tool for facilitating insertion into a hole of a circuit board a said wire wrap contact pin selected from the kit.

14. A kit of parts as claimed in claim 13, wherein the pin insertion tool comprises a substantially rigid elongate member having at one end a pair of laterally extending shoulders which extend substantially parallel to one another and which are transversely spaced apart to define a laterally extending channel, each shoulder having a thickness which is less than the distance between the lateral arms of two wire wrap pins when the pins are so positioned in holes in a circuit board that the lateral arms of the pins overlie holes in adjacent rows or columns of the board, and the channel having a Width slightly greater than the thickness of the lateral arm of the wire wrap pin and a depth less than the height of the lateral arm of the wire wrap pin.

15. A kit of parts as claimed in claim 1, wherein the kit also includes a block of cellular plastics material having a pair of opposed major surfaces lying in substantially parallel planes.

16. A kit of parts as claimed in claim 1, wherein the kit also includes a board of substantially rigid material having an array of columns and rows of holes whose pitch corresponds to that of the holes of a circuit board.

17. A kit of parts as claimed in claim 4, wherein the kit also includes a pin extraction tool for facilitating removal of a selected said wire wrap pin and its integral supplementary pin from a circuit board of the kind described.

18. A kit of parts as claimed in claim 17, wherein the pin extraction tool comprises substantially rigid elongate member having at one end a laterally extending head which has in its laterally extending end face at least two blind holes whose axes are substantially parallel to the axis of the elongate member and are laterally spaced apart by any one of n, 2n or 3n, where n is the pitch between adjacent holes in a circuit board, each of said blind holes having a depth which is at least slightly less than the axial length of the supplementary pin of a wire wrap pin and an internal diameter which is slightly greater than the lateral dimension of a wire wrap pin and its supplementary pin, and the head having a thickness which is substantially less than 2n.

19. A kit of parts as claimed in claim 18, wherein the head of the pin extraction tool has in its laterally extending end face four blind holes whose axes lie in a common plane, the axes of adjacent holes being laterally spaced apart by n and each hole having a depth which is slightly less than the axial length of the supplementary pin of a wire wrap pin.

20. A kit of parts as claimed in claim 18, wherein the head of the pin extraction tool has two blind holes, one of which blind holes (the deep hole) has a depth slightly less than the axial length of a wire wrap contact pin and the other of which blind holes (the shallow hole) has a depth less than that of the deep hole and slightly less than the axial length of the supplementary pin of a wire wrap contact pin.

21. A kit of parts as claimed in claim 20, wherein the kit includes two pin extraction tools in each of which the deep and shallow blind holes are spaced apart by a distance 3n and there is provided in the laterally extending end face of the head between the deep and shallow holes two additional blind holes, one of which is a deep hole and one of which is a shallow hole, whose axes are substantially parallel to and lie in the same plane as the axes of the deep and shallow holes, adjacent holes being spaced apart by a distance n, in one of the two pin extraction tools, the two deep holes being adjacent one another at one side of the head and the two shallow holes being adjacent one another at the other side of the head, and in the other of the two pin extraction tools, one deep hole being positioned between two shallow holes an done shallow hole being positioned between two deep holes.

22. A wire wrap contact pin suitable for insertion in a hole in, and for effecting electrical contact with an electrically conductive land of, a circuit board, which wire wrap contact pin has, integral with the trailing end of the pin and extending laterally with respect to its axis, an arm which, when the pin is engaged in said hole, bears against a major surface of the circuit board and is adapted to constitute a footprint of an adaptor to which footprint a surface mounted component can be soldered,
wherein the trailing end of the wire wrap contact pin is integral with the lateral arm at a positron at or near one end of the arm and the lateral arm has, at or near the other end of the arm, an integral supplementary pin which is so spaced from the wire wrapping that the supplementary pin will engage in another hole in the circuit board.

23. A wire wrap contact pin as claimed in claim 22, wherein the supplementary pin of said wire wrap contact pin is of a shorter length than that of the wire wrap pin.

24. A wire wrap contact pin as claimed in claim 22, wherein each wire wrap contact pin and each supplementary pin over a minor part of its length adjacent the lateral arm has a lateral dimension which is greater than the equivalent lateral dimension of the remaining major part of the length of the pin and which is such that said minor part of the length of the pin will make an interference fit in a hole of a circuit board.

25. A wire wrap contact pin as claimed in claim 22, wherein the wire wrap contact pin is notched at a position intermediate of its ends so that a part of the pin can be readily broken away if not required.

26. A wire wrap contact pin as claimed in claim 22, in which the rectilinear distance between the axes of the wire wrap pin and its supplementary pin is greater than n, where n is the pitch between adjacent holes in a circuit board, wherein the underlying edge of the lateral arm has a recess extending between end parts of said edge, which end parts constitute shoulders which, when the wire wrap and supplementary pins engage in holes in a circuit board, bear against a major surface of the circuit board.

* * * * *